(12) United States Patent
Hudner (10) Patent No.: US 9,755,655 B1
(45) Date of Patent: Sep. 5, 2017

(54) DYNAMIC QUANTIZERS HAVING MULTIPLE RESET LEVELS

(71) Applicant: Xilinx, Inc., San Jose, CA (US)

(72) Inventor: James G. Hudner, Charleville (IE)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 15/453,707

(22) Filed: Mar. 8, 2017

(51) Int. Cl.
*H03M 1/06* (2006.01)
*H03M 1/12* (2006.01)

(52) U.S. Cl.
CPC ....... *H03M 1/0609* (2013.01); *H03M 1/1245* (2013.01)

(58) Field of Classification Search
CPC .... H03M 1/0609; H03M 1/1245; H03M 3/30; H03M 3/50; H03M 7/3004
USPC ............. 341/155, 118; 327/195, 115; 326/59
See application file for complete search history.

(56) References Cited

U.S. PATENT DOCUMENTS

| | | | | |
|---|---|---|---|---|
| 4,821,286 | A * | 4/1989 | Graczyk ........... | H04L 25/03019 326/59 |
| 6,021,172 | A * | 2/2000 | Fossum ................ | G11C 19/282 257/239 |
| 6,456,215 | B1 * | 9/2002 | Frazier .................. | B82Y 10/00 327/195 |
| 7,420,497 | B2 * | 9/2008 | Chiu ................... | H03M 1/0607 330/252 |
| 7,903,017 | B2 * | 3/2011 | Hsieh ................... | G11C 27/024 341/155 |
| 8,730,404 | B2 * | 5/2014 | Daigle ............. | H03K 3/356191 327/115 |
| 9,287,862 | B2 * | 3/2016 | Viswanath ........... | H03K 17/063 |

OTHER PUBLICATIONS

Kim, Jaeha, et al., Impulse Sensitivity Function Analysis of Periodic Circuits; ICCAD, 2008, ICCAD 2008, Nov. 10-13, 2008, 6 pages, San Jose, CA.
Kim, Jaeha et al., Simulation and Analysis of Random Decision Errors in Clocked Comparators; 2009 IEEE Transactions on Circuits and Systems—I: Regular Papers, vol. 56, No. 8, Aug. 2009, 1844-1857.

(Continued)

*Primary Examiner* — Jean B Jeanglaude
(74) *Attorney, Agent, or Firm* — LeRoy D. Maunu (57) ABSTRACT

Various implementations are presented herein that improve the performance of dynamic quantizers over process, voltage and temperature ("PVT") and input common mode (Vcm) variations. This can be accomplished by separating and then varying the voltage supply to the reset devices connected to the input devices of the quantizer while leaving the supply to the other parts of the quantizer unchanged. The timing performance of the quantizer can be improved (reduced clock-to-q) by lowering the voltage supply to the reset devices. The input referred RMS noise and offset voltage of the circuit can be improved (reduced) by raising the voltage supply to the reset devices. Similarly, increases in Vcm due to process and voltage scaling can be mitigated by raising the voltage supply to the reset devices. Control systems are also provided herein to control the voltage supply to the reset devices to accomplish these and other objectives.

20 Claims, 10 Drawing Sheets

(56) References Cited

OTHER PUBLICATIONS

Kobayashi,Tsuguo et al., A Current-Controlled Latch Sense Amplifier and a Static Power-S aving Input Buffer for Low-Power Architecture; IEEE, 1993, IEEE Journal of Solid-State Circuits, vol. 28, No. 4, Apr. 1993, 523-527.
Miyahara, Masaya et al., A Low-Noise Self-Calibrating Dynamic Comparator for High-Speed ADCs; IEEE Asian Solid-State Circuits Conference, Nov. 3-5, 2008, 269-272, | Fukuoka, Japan.
Montanaro, James, et al., FP 13.3: A 16OMHz 32b OSW CMOS RISC Microprocessor; 1996 IEEE International Solid-State Circuits Conference, 3 pages.
Nikoozadeh, Amin et al., An Analysis of Latch Comparator Offset Due to Load Capacitor Mismatch; IEEE Transactions on Circuits and Systems—II: Express Briefs, vol. 53, No. 12, Dec. 2006, 1398-1402.
Nuzzo, Pierluigi et al., Noise Analysis of Regenerative Comparators for Reconfigurable ADC Architectures; 2008 IEEE Transactions on Circuits and Systems—I: Regular Papers, vol. 55, No. 6, Jul. 2008, pp. 1441-1454.
Schinkel, Daniel et al.,17.7 A Double-Tail Latch-Type Voltage Sense Amplifier with 18ps Setup+Hold Time; 2007 ISSCC, 2007 IEEE International Solid-State Circuits Conference, 3 pages.
Toifl, Thomas et al., A 22-Gb/s PAM-4 Receiver in 90-nm CMOS SOI Technology; IEEE Journal of Solid-State Circuits, vol. 41, No. 4, Apr. 2006, 954-965.
Wang, Niantsu, N., On the Design of MOS Dynamic Sense Amplifiers; 1982 IEEE Transactions on Circuits and Systems, vol. CAS-29, No. 7, Jul. 1982, 467-477.
Wang,Yun-Ti, et al., An 8-Bit 150-MHz CMOS A/D Converter; 2000 IEEE Journal of Solid-State Circuits, vol. 35, No. 3, Mar. 2000, 308-317.

\* cited by examiner

DYNAMIC QUANTIZERS HAVING MULTIPLE RESET LEVELS

TECHNICAL FIELD

The disclosure generally relates to quantizers, and more particularly to quantizers having multiple voltage supplies.

BACKGROUND

Quantizer circuits, sometimes referred to as "slicers", are a type of high-speed clocked comparator which are used in serializer/deserializer ("SerDes") and analog-to-digital conversion ("ADC") circuits to quantize an analog signal to a digital bit. Three of the most important performance parameters of quantizers are timing measured as clock-to-q, input-referred RMS noise, and input-referred offset voltage. Input-referred RMS noise and offset voltage performance are linked by a common parameter, namely forward voltage gain, as both quantities are input-referred.

Quantizers can be broadly grouped into dynamic or static quantizers, wherein dynamic quantizers do not have any static power dissipation, and static quantizer types such as current mode logic ("CML") quantizers do. Dynamic quantizers can be further sub-categorized into two groups, the first having what is sometimes referred to as having a STRONGARM®-type topology, sometimes referred to as a sense amplifier. The other group has what is sometimes referred to as a double-tail latch topology, which has comparatively greater sensitivity, lower input referred RMS noise and offset voltage for a given timing performance.

Dynamic quantizer timing performance is typically lowest at slow transistor process corner, high temperature and minimum supply voltage, as this process corner provides the minimum current and causes the slowest charging of the internal quantizer nodes. Input-referred RMS noise and offset voltage is typically worst at fast transistor process corner, high temperature and minimum supply voltage because that is the worst voltage gain process corner. As described herein, these process corners are referred to as the worst case timing and worst case RMS noise corners, respectively.

Previous approaches for improving input referred RMS noise and offset voltage of quantizers having the STRONGARM®-type topology have included reducing tail current, which raises the voltage gain of the quantizer. However, this reduction in tail current increases clock-to-q time of the quantizer and thus degrades timing performance. Other approaches have included increasing tail current to improve clock-to-q time of the quantizer. However, this technique reduces gain and thus impairs input referred RMS noise and offset voltage. A further approach can include increasing the input device size to increase gain rather than reducing tail current to improve input referred RMS noise and offset voltage of the quantizer. However, this causes undesirable increases in input capacitance to driving circuits and internal parasitic capacitance which also degrades timing performance.

The present disclosure provides improvements for the configuration and operation of quantizers to address these and other issues, as set forth below.

SUMMARY

A number of implementations are directed toward a quantizer circuit for digitizing an analog signal. The quantizer typically includes an input circuit, a regeneration circuit and a reset circuit. The input circuit generally includes a plurality of input field effect transistors, and is coupled to a first voltage supply that supplies an input signal at a first voltage. The input circuit converts the input signal into an input current that is integrated during an input sampling phase of an active cycle of operation of the quantizer circuit. The regeneration circuit is coupled to the input circuit, and includes a plurality of regeneration field effect transistors. The regeneration circuit is connected to a second voltage supply at a second voltage. The second voltage is typically different in magnitude from the first voltage. The reset circuit, in turn, is coupled to the input circuit and the regeneration circuit.

In some implementations, the first voltage and second voltage can be fixed. If desired, the first voltage can be proportional to or derived from the second voltage. The first voltage can be configured to be higher than the second voltage to reduce noise and voltage offset in the quantizer circuit. In some implementations, the first voltage can be configured to be lower than the second voltage to improve timing performance of the quantizer circuit. The input circuit is preferably configured to receive a first time varying first clock signal, and the input circuit does not draw current when the first clock signal is below a threshold voltage.

In some implementations, the input circuit can be further configured to receive a second time varying clock signal. The magnitude of the second clock signal can be generated with reference to the first clock signal. For example, the second clock signal can be generated by a circuit supplied from a regulator that is configured to receive a signal indicative of the first clock signal.

In some implementations, the second voltage can be at ground and the first voltage can be lower than the second voltage to reduce noise and voltage offset in the quantizer circuit. In other implementations, the second voltage can be at ground, and the first voltage can be higher than the second voltage to improve timing performance of the quantizer circuit.

In accordance with further aspects of the disclosure, a control circuit is provided for operating quantizers in accordance with the present disclosure that is configured to increase or decrease the magnitude of the first voltage. The control circuit can include analog and/or digital components. In some implementations, an analog control circuit is provided that is configured to generate a reference signal representative of the first voltage. A regulator can be provided that is in operable communication with the analog control circuit that can be configured to output the first voltage to the quantizer circuit in response to the reference signal that is representative of the first voltage. If desired, the analog control circuit can generate the reference signal in response to a plurality of input signals. The input signals to the analog control circuit can include, for example, signals indicative of at least one of the magnitude of the second voltage, a process dependent voltage, a temperature dependent voltage, and/or a shift voltage.

In some implementations, the control circuit can include at least one analog to digital converter that is configured to receive a plurality of input signals and generate digital input signal data, a programmable integrated circuit operably coupled to the analog to digital converter, the programmable integrated circuit being configured to process the digital input signal data to determine circuit configuration data and generate a circuit configuration data digital output signal, and at least one digital to analog converter operably coupled to the processor. The at least one digital to analog converter can be configured to convert the circuit configuration data digital output signal into the reference signal representative of the first voltage. The input signals can include signals indicative of at least one of the magnitude of the second voltage, a process dependent voltage, a common mode voltage, a temperature dependent voltage, and/or a shift voltage. The control circuit can further include a regulator in operable communication with the at least one digital to analog converter. The regulator can be configured to output the first voltage to the quantizer circuit in response to the reference signal that is representative of the first voltage. In various implementations, the programmable integrated circuit can be programmed with executable code for determining the configuration data. In further accordance with various embodiments, the quantizer circuit can include a topology typical of STRONGARM®-type quantizers and "double tail"-type quantizers, among others. Other features will be recognized from consideration of the Detailed Description and Claims, which follow.

BRIEF DESCRIPTION OF THE DRAWINGS

Various aspects and features of the disclosed devices and related methods will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Various implementations are presented herein that improve the overall performance of dynamic quantizers (or slicers) over process, voltage and temperature ("PVT") and input common mode (Vcm) variations. As set forth herein, certain embodiments are provided that improve the performance of a quantizer circuit by separating and then varying the voltage supply to the reset devices connected to the input devices of the quantizer while leaving the supply to the other parts of the quantizer unchanged. In some implementations, the timing performance of the quantizer can be improved (reduced clock-to-q) by lowering the voltage supply to the reset devices. In other implementations, the input referred RMS noise and offset voltage of the circuit can be improved (reduced) by raising the voltage supply to the reset devices. Similarly, increases in Vcm due to process and voltage scaling can be mitigated by raising the voltage supply to the reset devices. Control systems are provided herein to control the voltage supply to the reset devices to accomplish these and other objectives.

The disclosed embodiments permit tail current to be increased to meet the required timing performance and then subsequently increase the level of the voltage supply to the reset devices in the aforementioned "worst case" RMS noise process corner to allow improvement of input referred RMS noise and offset voltage performance. Conversely, the disclosed embodiments permit the reduction of the tail current to meet the required input referred RMS noise and offset voltage performance and then lower the level of the voltage supply to the reset devices in the aforementioned "worst case" timing process corner to facilitate the improvement of timing performance.

Accordingly, the disclosed embodiments provide additional flexibility in the design of dynamic quantizers, such as those of the STRONGARM®-type or double-tail type latch topologies. In particular implementations, this is achieved by disconnecting the supply for the reset devices connected to the input devices from the main supply (referred to herein as Avcc or Avss) and connecting them to a separately controlled supply (referred to herein as Avccrst or Avssrst) to improve performance of the quantizer. This therefore facilitates raising/lowering the new Avccrst/Avssrst level to (i) improve input referred RMS noise and offset voltage performance of a quantizer and/or to (ii) mitigate Vcm increases. This also facilitates lowering/raising the Avccrst/Avssrst level to improve timing performance of a quantizer. These objectives can be facilitated by generating (i) a process and temperature (PT), (ii) process and voltage (PV), or (iii) process, voltage and temperature (PVT) dependent supply voltage to drive the new Avccrst/Avssrst supply, wherein "V" can be configured to be an appropriate combination of Avcc and Vcm.

Using a PVT compensated, logic Low supply to generate an Avccrst referenced clock allows reliable operation and avoids TDDB, HCl and BTI degradation, and which also generates a PVT compensated overdrive to the reset devices to enable them to operate at full clock rate.

The scope of the disclosure is applicable to dynamic quantizers, such as those of the STRONGARM®-type or double-tail type latch topologies. In the case of quantizers having a STRONGARM®-type topology, disclosed embodiments allow simultaneous improvement of timing performance and reduction of input referred RMS noise and offset voltage. While the disclosed embodiments are applicable to dynamic quantizers which are primarily used in the fields of serial communications and ADCs, they may also be used in other fields of detection, and are applicable to any circuit that makes use of resettable integration for signal gain. In the case of the double-tail latch quantizer topology, the disclosed embodiments can be used for improvement of both (a) timing performance and (b) input referred RMS noise and offset voltage.

Figure 1:
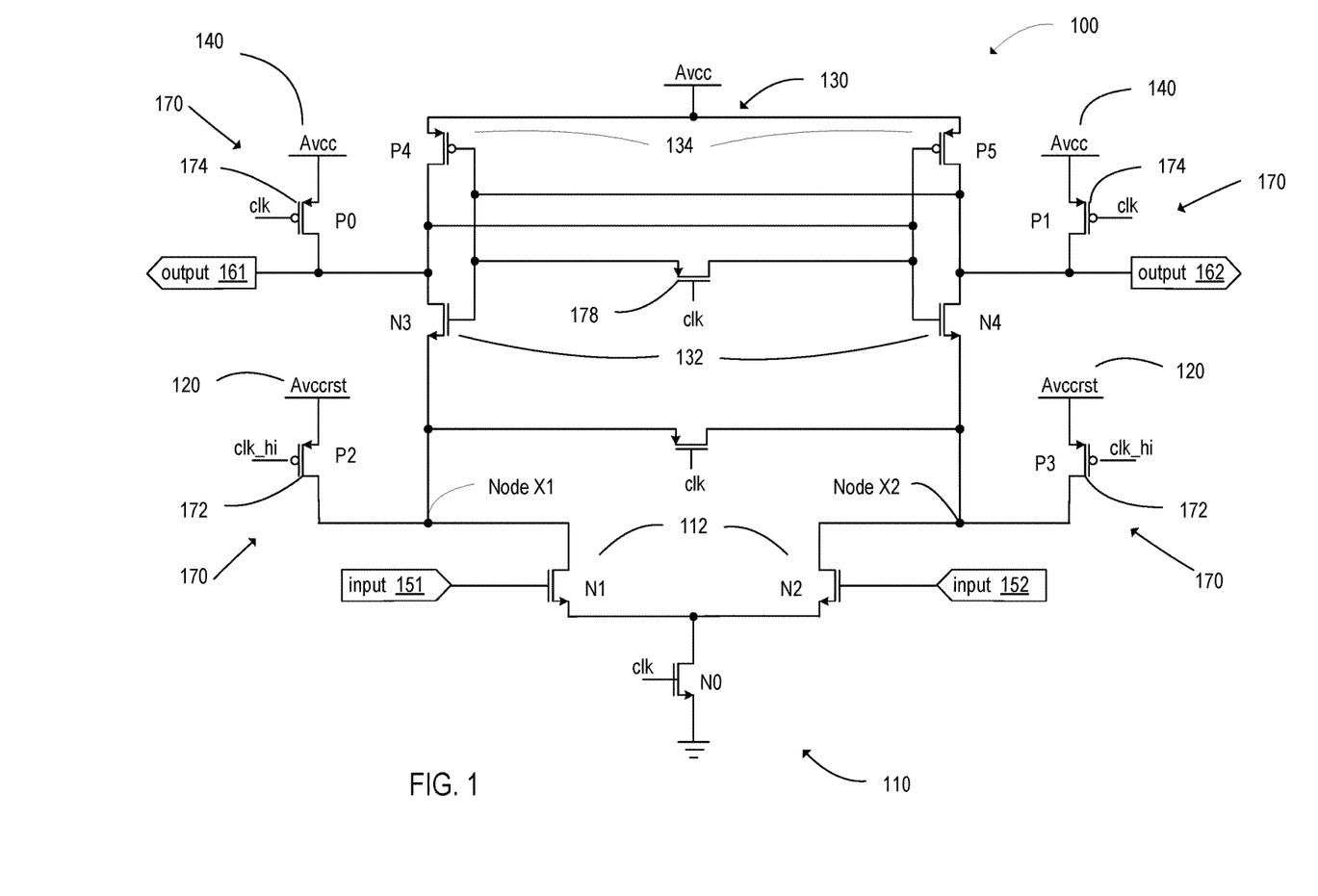
FIG. 1 depicts a quantizer in accordance with a first implementation of the present disclosure.

Turning now to the figures, for purposes of illustration, and not limitation, FIG. 1 depicts a quantizer in accordance with a first implementation of the present disclosure having a STRONGARM®-type topology. As illustrated in FIG. 1, a quantizer circuit 100 for digitizing an analog signal is presented that includes an input circuit, a regeneration circuit and a reset circuit. The input circuit 110 includes a plurality of input field effect transistors 112 and is coupled to a first voltage supply 120 that supplies an input signal at a first voltage, represented herein as Avccrst. As illustrated, the input circuit 110 is configured to receive a first time varying first clock signal (clk). The input circuit does not draw current when the first clock signal is below a threshold voltage and is active and consumes current when the first clock signal is above a threshold voltage.

The regeneration circuit 130 is coupled to the input circuit 110, and includes a plurality of regeneration field effect transistors 132, 134. The regeneration circuit is connected to a second voltage supply 140 at a second voltage Avcc. The second voltage Avcc is different in magnitude from the first voltage Avccrst (higher or lower, as desired) to bring about desired performance improvements as set forth herein.

The reset circuit 170 is coupled to the input circuit 110 and the regeneration circuit 130. The reset circuit 170 includes a first set of transistors 172 that couple the input circuit 110 to the first voltage supply 120, and a second set of transistors 174 that couple the regeneration circuit 130 to the second voltage supply 140, and a third transistor 178 that couples output pin 161 to output pin 162.

In operation the input circuit 110 converts the input signal via input pins 151, 152 into an input current that is integrated during an input sampling phase of an active cycle of operation of the quantizer circuit 100. During the input sampling phase, only devices N0, N1 and N2 (112) are initially on as the reset phase from the previous cycle is complete and PMOS's P0, P1, P2 and P3 (172, 174) of the reset circuit are off.

To improve gain and thus reduce noise/voltage offset, for example, it is desirable that the devices in input circuit 110 operate in saturation for as much of the active cycle as possible, albeit at the expense of timing performance as eventually all the devices enter the linear region (exit the saturation region) as regeneration occurs. The device N0 enters the linear region first once the voltage on its drain is less than Avcc−Vth0. This is followed later by devices N1 and N2 entering the linear region when nodes X1 and X2 become less than (Vcm−Vth1) and (Vcm−Vth2) respectively, wherein Vcm is the common mode voltage at the inputs 151, 152 and Vth0, Vth1 and Vth2 are the respective threshold voltages of devices N0, N1 and N2. The input sampling phase ends approximately at the same time that N1 and N2 enter the linear region.

Towards the end of the input sampling phase (before N1 and N2 enter the linear region), and once nodes X1 and X2 become less than (Avcc−Vth34), wherein Vth34 is the threshold voltages of N3 and N4, the regeneration devices N3 and N4 turn on to from a secondary integration network. N3 and N4 are also saturated during this time, and regeneration around these devices begins. The quantizer circuit 100 remains in the second phase of operation as long as N1-N4 remain in saturation.

Once N3 and N4 have been on long enough to discharge at output pins 161, 162 to less than (Avcc−Vthp12), wherein Vthp12 is the threshold voltages of P1 and P2, full regeneration begins. The regeneration circuit 130 amplifies the differential voltage, generated by the input circuit across nodes X1 and X2 (and also by N3/N4 across output pins 161, 162) during the input sampling phase, using positive feedback to create large signal voltages close to CMOS levels at output pins 161, 162.

As the quantizer circuit 100 enters a third phase of operation, P4, P5, N3 and N4 regenerate. This third phase begins when any of N1 to N4 are no longer saturated. N3 and N4 continue to regenerate in the third phase, and P4 and P5 start to conduct. The third phase of operation ends at reset on the falling edge of the clock signal.

Advantages in accordance with the disclosure originate from providing multiple voltage supplies to the quantizer 100, and in some embodiments, varying the relative voltage levels of the voltage supplies.

Input referred RMS noise and input referred offset voltage can both be reduced by increasing the quantizer gain. It should be noted that the exemplary quantizers illustrated herein are illustrated without offset correction. However, as will be appreciated, quantizers of all static and dynamic topologies can usually be provided with input referred voltage offset correction based on either current/voltage or capacitive correction as are known in the art.

Since the quantizer 100 operates in a sequence of phases as set forth above, the gain in earlier phases provide greater reduction of input referred RMS noise and offset voltage. Thus, by increasing the gain in the first phase of quantizer operation, input referred RMS noise and offset voltage can be reduced. Thus, Avccrst can be adjusted, or simply fixed to a value that is greater than Avcc to reduce RMS noise and voltage offset.

Conversely, Avccrst can be adjusted, or simply fixed to a value that is less than Avcc to reduce clock-to-q and improve timing. In accordance with further implementations, Avccrst can be controlled to be set at a value that tracks a combination of process, voltage and temperature (PVT) to improve timing and reduce RMS noise and voltage offset over various operating conditions of the quantizer.

In accordance with a further aspect of the disclosure, quantizers can compensate for an increase in input common mode voltage (Vcm) with minimal power increase. This is particularly advantageous where supply voltages scale down with geometry. Quantizers normally are placed at the boundary between the analog and digital signal processing. This usually means that its input is delivered from a higher analog supply domain than its own digital supply domain (e.g., Avcc). The average of this input is called the common mode input voltage, Vcm. High Vcm values reduce gain and thus increase RMS noise and offset voltage.

As process technologies scale down, digital supply also reduces (e.g. from 0.85 v to 0.75 v), for example, to mitigate reliability issues, to reduce digital power consumption for fixed processing performance, or to increase digital processing performance for constant or reduced power consumption. Accordingly, the analog supply does not reduce or its reduction is less than the digital supply reduction which means the Vcm of the quantizer has effectively been raised relative to the new lower Avcc value of the quantizer.

In this situation, notwithstanding the present disclosure, the skilled artisan would only have two options with respect to the present sense amplifier (e.g., STRONGARM®-type) quantizer topologies. One could tolerate lower gain and thus higher RMS noise and voltage offset, or do not scale down quantizer supply to preserve quantizer gain. However, the latter option results in having to tolerate higher power consumption in quantizer, needing to add a regulator to generate an older, unscaled Avcc level, and to level shift the quantizer output down to Avcc. However, by employing the present teachings, Avccrst can retain the older, unscaled Avcc supply voltage level (e.g. 0.85 v). This preserves gain and thus RMS noise and offset voltage are improved. The remainder of quantizer is then powered by the scaled Avcc level (e.g. 0.75 v).

In accordance with the present disclosure, Avccrst can be fixed, or it can be varied in a controlled manner, depending on the desired application. Thus, in some implementations, the first voltage (Avccrst) and second voltage (Avcc) can be fixed relative to one another. If desired, the first voltage (Avccrst) can be proportional to or derived from the second voltage (Avcc). As mentioned above, the first voltage (Avccrst) can be higher than the second voltage (Avcc) to reduce noise and voltage offset in the quantizer circuit. In some embodiments, the first voltage (Avccrst) can be lower than the second voltage (Avcc) to improve timing performance of the quantizer circuit, as described above.

Figure 2:
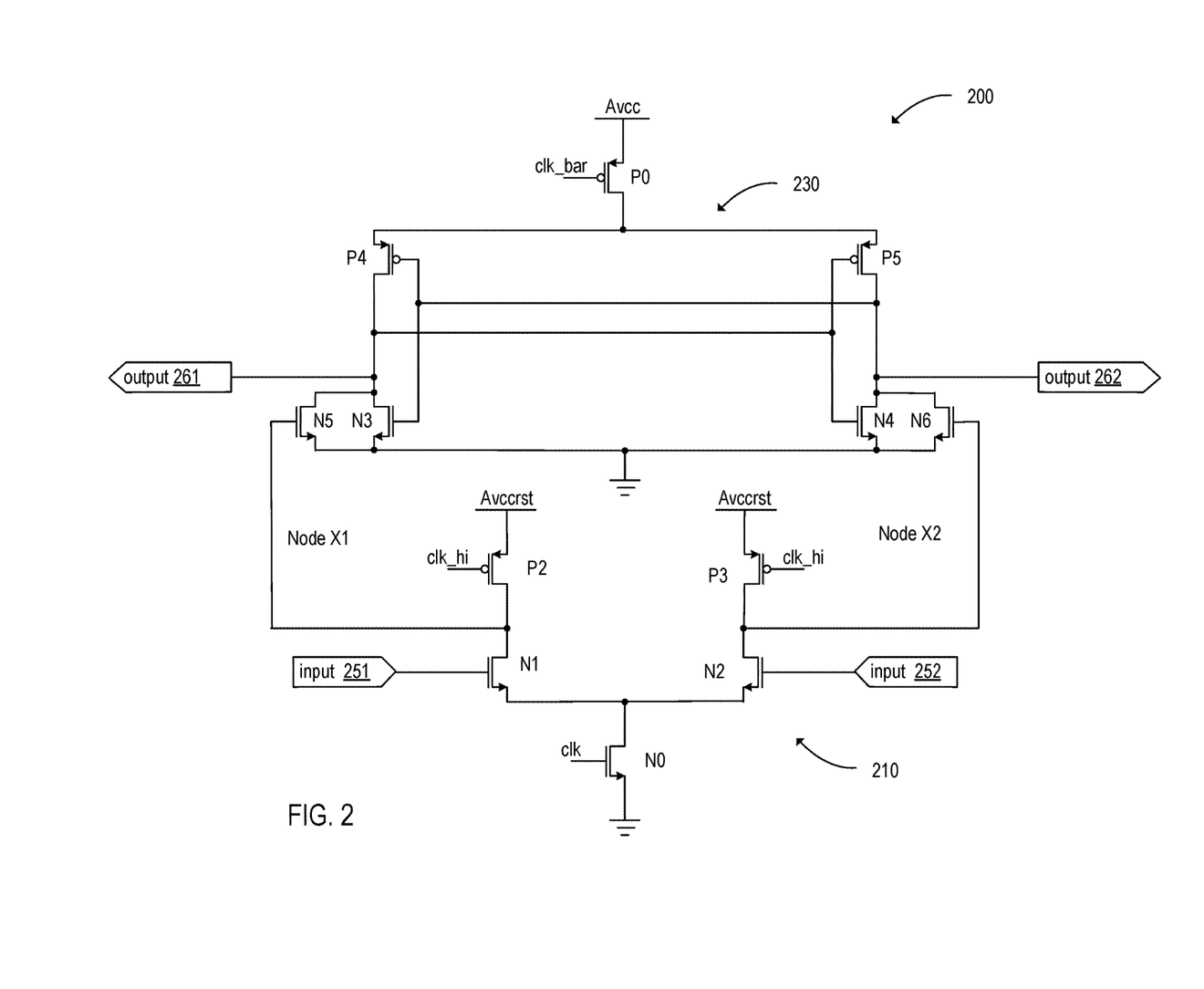
FIG. 2 depicts a quantizer in accordance with a second implementation of the present disclosure.
Figure 3:
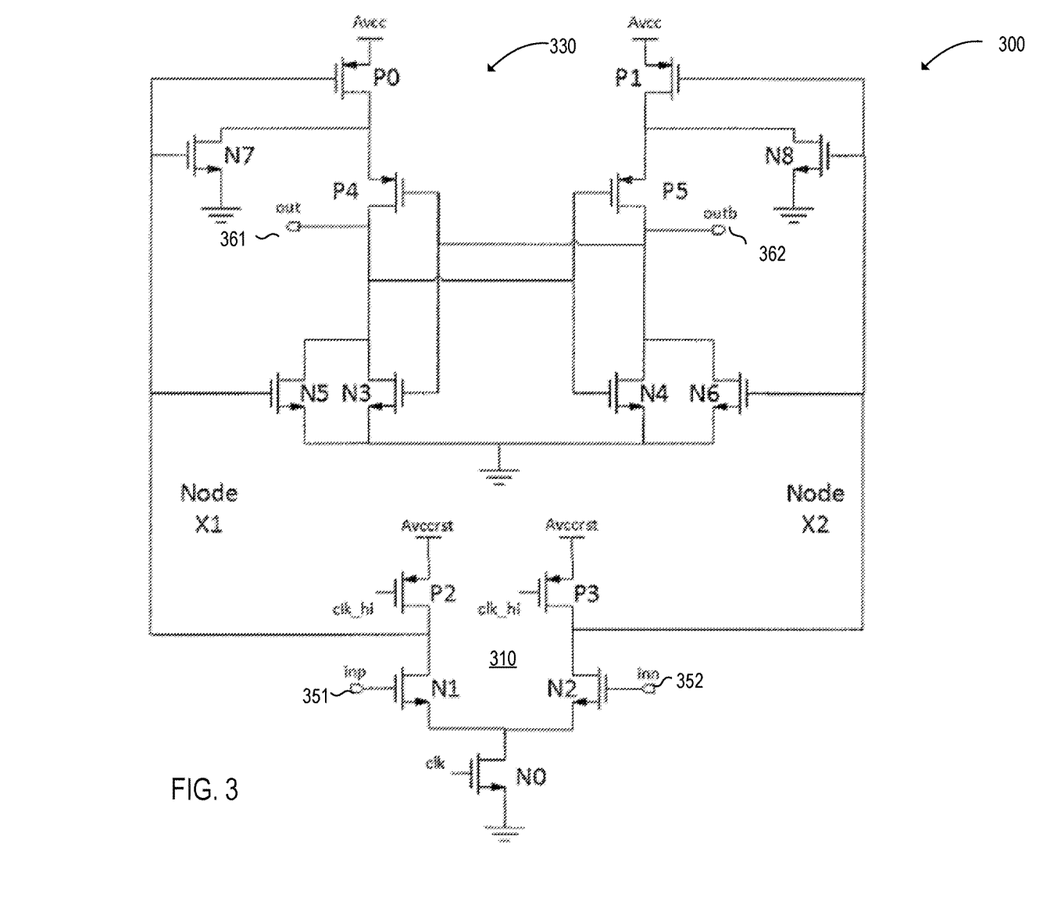
FIG. 3 depicts a quantizer in accordance with a third implementation of the present disclosure.

FIGS. 2 and 3 depict further embodiments of quantizers 200, 300, respectively in accordance with the present disclosure. Quantizers 200, 300 are of the "double tail" type, and include input circuits 210 and 310, respectively. Each of the input circuits includes N0, N1, N2, N5 and N6 (wherein N5 and N6 provide additional gain) and a regeneration circuit 230, 330 including N3, N4, P4 and P5 (and N7 and N8 in the case of circuit 300). N7 and N8 can be considered to be a part of the reset circuit for simplicity, although they also provide additional gain as they combine with P0 and P1 (FIG. 3).

Each of circuits 210, 230 has separate currents which allow input stage gain and regeneration stage timing to be optimized separately. Specifically, the input devices (N1, N2, N5, N6) have separate currents from the regeneration devices (N3, N4, P4, P5).

The quantizer 200 of FIG. 2 includes a dual phase clock, whereas the quantizer of FIG. 3 includes a single phase clock. The embodiment of FIG. 3 includes an extra gain path from Nodes X1, X2 to out, outb by way of P0, P1, N7, N8.

The input circuit 210, 310 integrates the input in exactly the same way as the embodiment of FIG. 1 onto nodes X1 and X2. Input circuit 210, 310 contributes gain from the input 251, 252 (351, 352) as long as the input devices N1 and N2 are saturated. However, by adding Avccrst pins, it is possible to increase the initial voltage as with the embodiment of FIG. 1. Increasing the initial starting voltage in such a manner has the same practical effect as reducing the tail current in terms of increasing the time that occurs before the input pair N1, N2 come out of saturation. This increases integration time and therefore increases gain, and thus reduces RMS noise and offset voltage.

In some implementations, the second voltage can be at ground and the first voltage can be lower than the second voltage to reduce noise and voltage offset in the quantizer circuit. For example, the second voltage can be at ground, and the first voltage can be higher than the second voltage to improve timing performance of the quantizer circuit.

Figure 4:
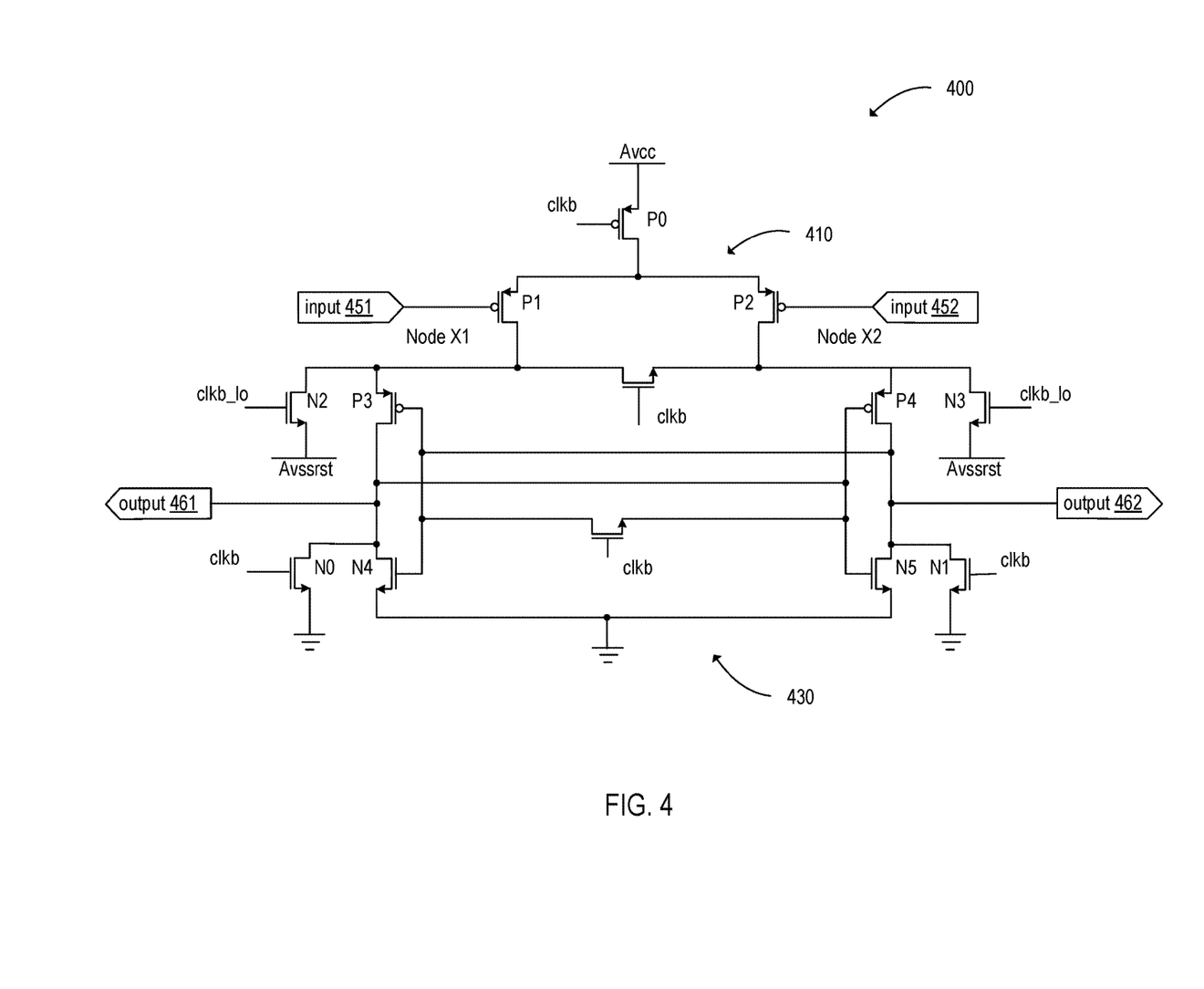
FIG. 4 depicts a quantizer in accordance with a fourth implementation of the present disclosure.
Figure 5:
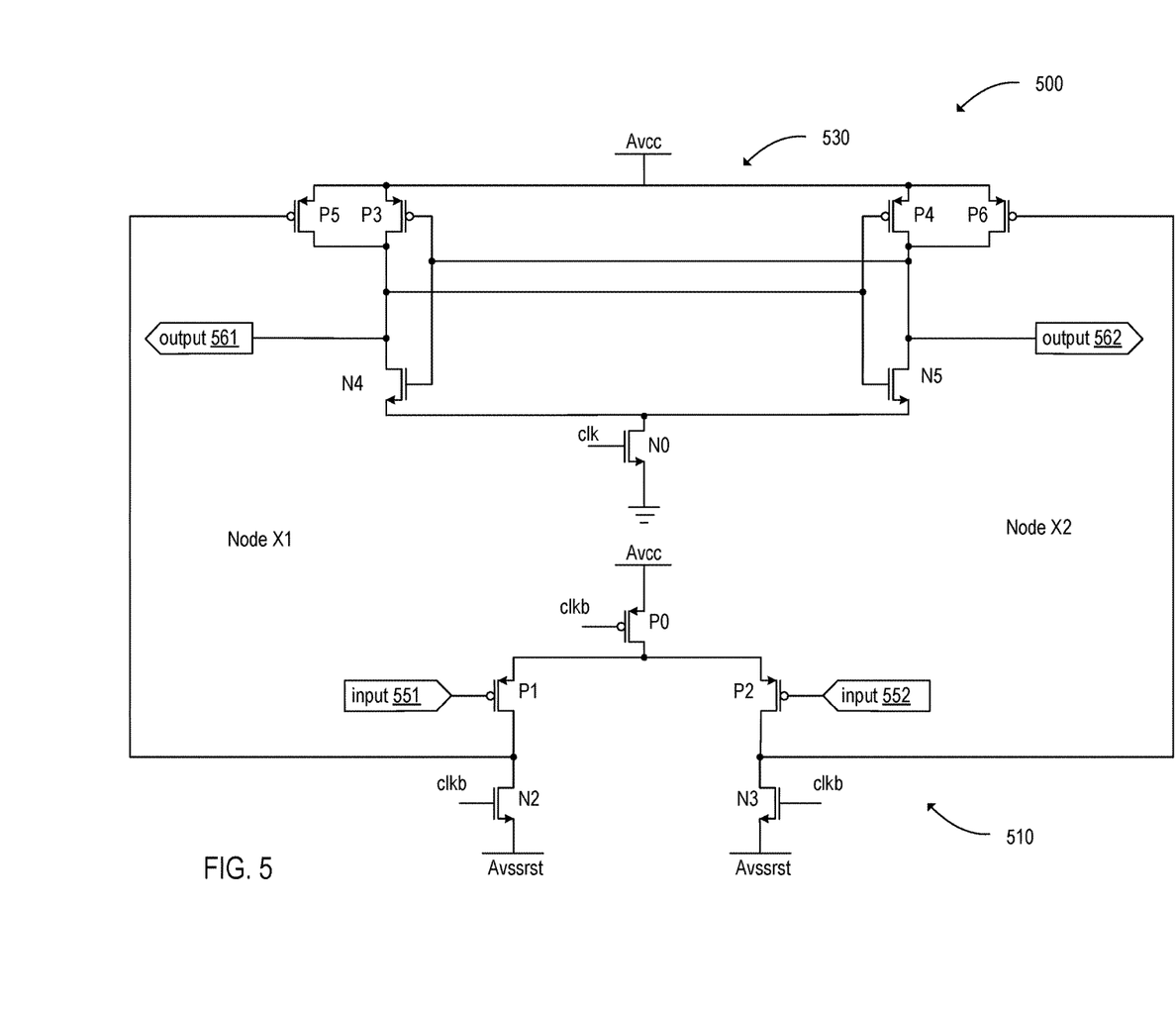
FIG. 5 depicts a quantizer in accordance with a fifth implementation of the present disclosure.
Figure 6:
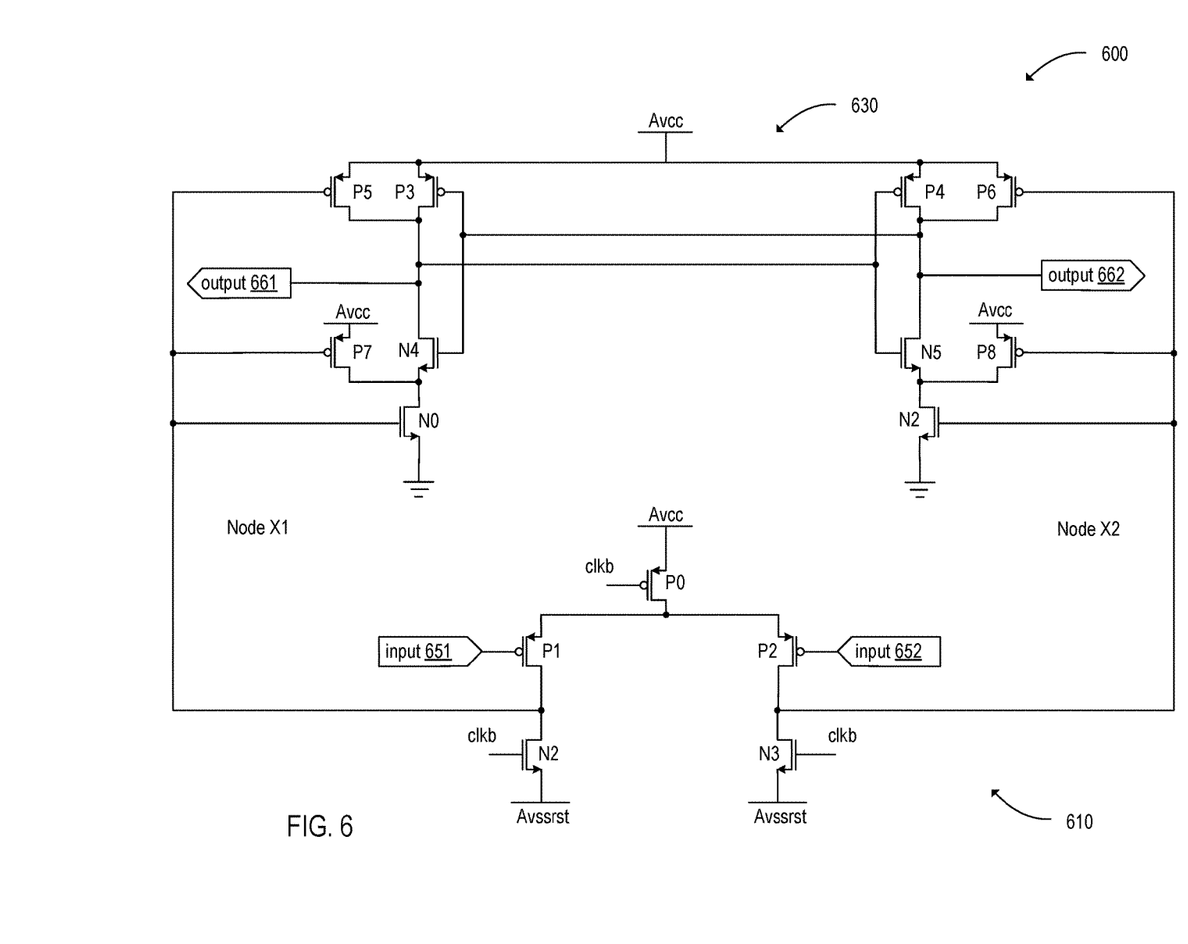
FIG. 6 depicts a quantizer in accordance with a sixth implementation of the present disclosure.

For purposes of illustration, and not limitation, FIGS. 4, 5 and 6 depict quantizers 400, 500, 600 in accordance with further implementations of the present disclosure. In some implementations, it can be convenient to use a low input common mode voltage (Vcm) at the point where the analog signal is quantized to a digital bit. This leads to a low input Vcm for the quantizer. The quantizers 100, 200 described herein above have NMOS input pair(s) which are suited to a high input Vcm. Each of the aforementioned quantizers can be inverted from a high input Vcm, NMOS input pair(s) quantizer to a low input Vcm, PMOS input pair(s) quantizer. In such low input Vcm circuits, the reset voltage is swapped from Avcc to ground (Gnd), or Avss. In the case of the double tail latch topology, the output reset is swapped from ground (Avss) to Avcc. FIGS. 4, 5 and 6 illustrate these low input Vcm, PMOS input pair quantizers for three topologies, including a STRONGARM®-type technology (FIG. 4), a double tail latch topology (FIG. 5) and a modified double tail latch topology (FIG. 6).

The low input Vcm, PMOS input pair(s) quantizers of FIGS. 4-6 all integrate the input in the input circuits (410, 510, 610) onto nodes X1 and X2 in the same way as the embodiments of FIGS. 1-3. The input circuit of these embodiments contributes gain from the input as long as the input devices P1 and P2 are saturated. Ordinarily, in such topologies, the drains are reset to Avss and are then pulled upwards towards Avcc by the common mode current. In accordance with the present disclosure, the initial voltage can be decreased by adding pins to apply Avssrst rather than Avss. This acts to decrease the initial voltage Avssrst to a voltage less than ground (Avss), resulting in increased integration time, which in turn increases gain and decreases input referred RMS noise and input offset voltage. Conversely, increasing Avssrst to a voltage that is greater than ground decreases integration time, which increases timing performance by reducing clock-to-q. In the same way as previously described the level of Avssrst can be fixed, or varied over PVT in an optimized manner to improve both input referred RMS noise and input offset voltage, and/or timing performance.

In accordance with further aspects of the disclosure, embodiments of a control circuit are provided that are configured to increase or decrease the magnitude of the first voltage with respect to Avcc or Avss for operating quantizers in accordance with the present disclosure.

Figure 7A:
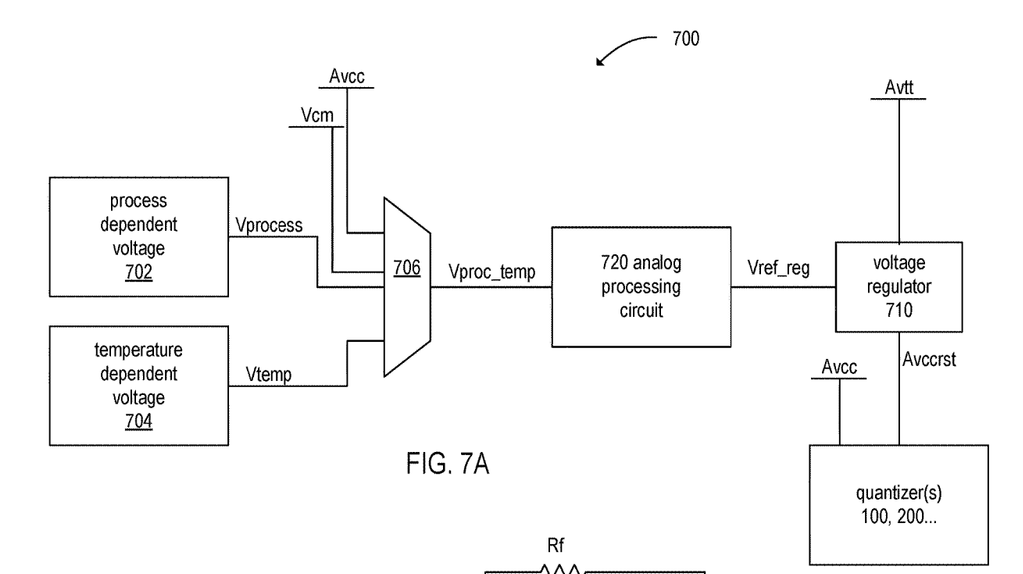
FIG. 7A depicts a first implementation of a control circuit for controlling a quantizer in accordance with the present disclosure.
Figure 7B:
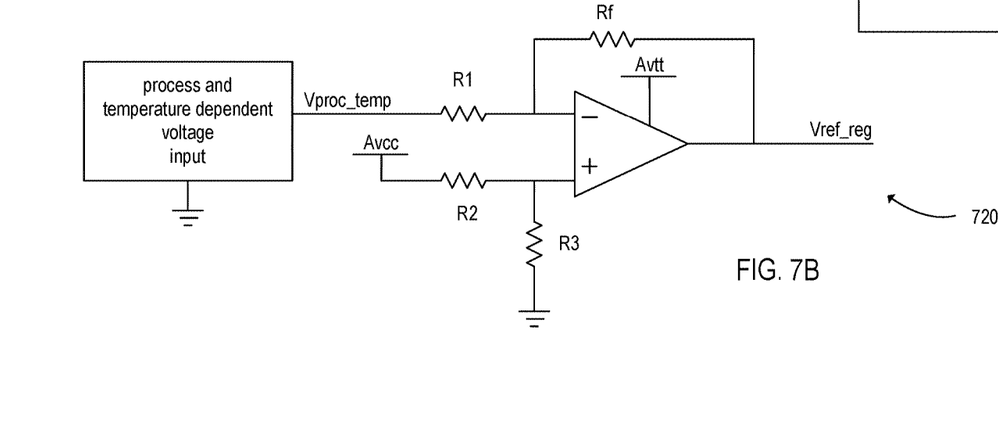
FIG. 7B depicts an portion of the control circuit of FIG. 7A in accordance with the present disclosure.

As illustrated in FIGS. 7A-7B, the control circuit can include an analog control circuit 700 that is configured to generate a reference signal representative of the first voltage. A regulator 710 can be provided that is in operable communication with the analog control circuit 700. The regulator 710 can be configured to output the first voltage to the quantizer circuit in response to the reference signal that is representative of the first voltage. The analog control circuit can generate the reference signal (Vref_reg) in response to a plurality of input signals (702, 704, Avcc, Vcm). The input signals can include signals indicative of at least one of the magnitude of the second voltage, a process dependent voltage, a temperature dependent voltage, or a shift voltage. FIG. 7B depicts a possible implementation of a summer used in the control circuit of FIG. 7A, where other summer topologies, both voltage & current summers, may also be used by those skilled in the art, in accordance with the present disclosure. As will be appreciated, process dependent voltage and temperature dependent voltage inputs, along with Avcc (or Avss) can be provided to a programmable switch or summer 706 which is then processed in circuit 720 to produce the reference voltage which is outputted to the regulator.

The processing circuit 720 includes an operational amplifier that will output a voltage that is more or less than Avcc depending on the input process and temperature dependent voltage. Thus, by selecting the input process and temperature dependent voltage appropriately, the reference voltage, and thus Avccrst can be more or less than Avcc. Similarly, if Avss is being referenced, the input process and temperature dependent voltage can be selected to have Avssrst be more or less than Avss. As will be appreciated, FIGS. 7A-7B (as well as the other figures herein) are intended to be illustrative and not limiting.

Figure 8:
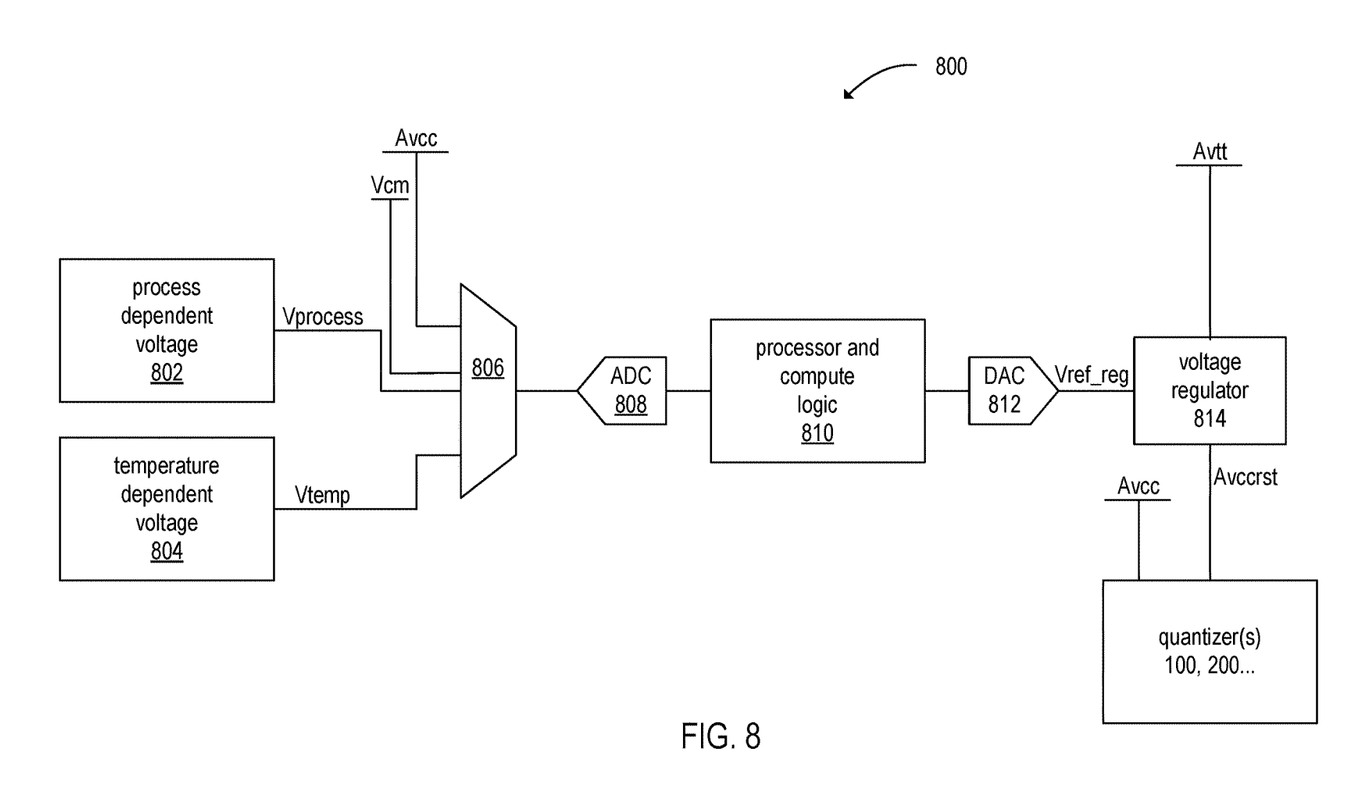
FIG. 8 depicts a second implementation of a control circuit for controlling a quantizer in accordance with the present disclosure.

As illustrated in FIG. 8, in some implementations, the control circuit 800 can include at least one analog to digital converter 808 that is configured to receive a plurality of input signals and generate digital input signal data, a programmable integrated circuit (810) operably coupled to the at least one analog-to-digital converter ("ADC") 808, the programmable integrated circuit (810) being configured to process the digital input signal data to determine circuit configuration data and generate a circuit configuration data digital output signal, and at least one digital to analog converter (812) operably coupled to the processor. The at least one digital to analog converter can be configured to convert the circuit configuration data digital output signal into the reference signal representative of the first voltage.

The input signals can include signals indicative of at least one of the magnitude of the second voltage, a magnitude of the common mode voltage (Vcm), a process dependent voltage 802, a temperature dependent voltage 804, or a shift voltage. As depicted, a single ADC and a multiplexer can sequentially poll these four analog inputs to generate a digital code from the selected analog input signal. However, it is also possible (although more costly in terms of hardware) to use a larger number of ADC's, such as one ADC per input signal (e.g., four total) and send four digital codes, one corresponding to each input signal, to the processor, in parallel.

The control circuit (800) can further include a regulator (814) in operable communication with the at least one digital to analog converter (812). The regulator can be configured to output the first voltage (Avccrst) to the quantizer circuit in response to the reference signal (Vref_reg) that is representative of the first voltage. In various embodiments, the programmable integrated circuit (810) can be programmed with executable code for determining the configuration data.

Figure 9:
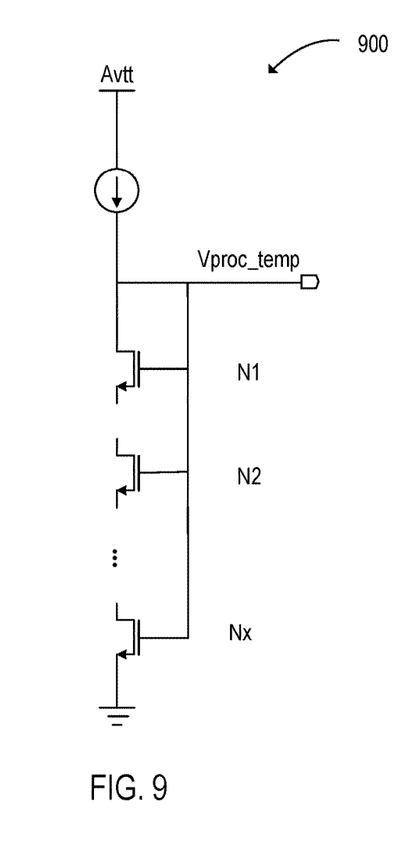
FIG. 9 depicts a circuit for analog process and temperature dependent voltage generation in accordance with the present disclosure.

FIG. 9 depicts a circuit 900 for analog process and temperature dependent voltage generation in accordance with the present disclosure. The analog Vref_reg generation circuit needs an analog process and temperature dependent voltage (Vproc_temp). One embodiment of the analog process and temperature dependent voltage generation is shown here. As illustrated in FIG. 9, a current is forced into a stack of X NMOS devices. The number of devices, X, is chosen to set the required Vproc_temp. The device at the top of the stack can be selected to match N3/N4 in the circuit (e.g., 100) order to track Vt, and lower devices can be selected to match i/p beta (N1/N2) and track gm.

Figure 10:
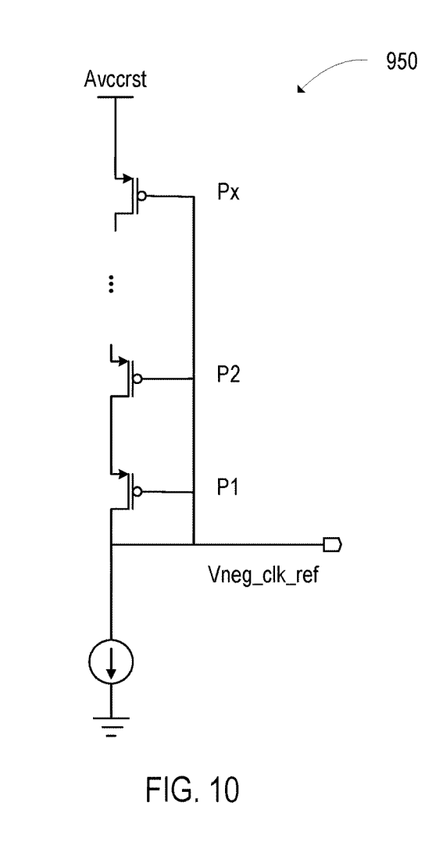
FIG. 10 depicts a circuit for generating a low side reference for a regulator that supplies a clock generator that generates a clock signal in accordance with the present disclosure.

FIG. 10 depicts a circuit 950 for generating a low side reference for a regulator that supplies a clock generator that generates a clock signal in accordance with the present disclosure. In some implementations, the input circuit (e.g., 110) can be further configured to receive a second time varying clock signal (clk_hi). The magnitude of the second clock signal can be generated with reference to the first clock signal. The second clock signal (clk_hi) can be generated by a circuit that is configured to receive a signal indicative of the first clock signal and is supplied from a regulator that is configured to receive a low side reference voltage.

When Avccrst>Avcc the PMOS the reset devices P2, P3 in the quantizer need a clock (clk_hi) that has a logic High level of Avccrst rather than Avcc. The clock buffer for the quantizer 100 generates a clock named clk which has a logic High level of Avcc. Clk_hi can be generated from clk using a high speed, AC coupled clock generator as described in the literature. However the low logic level of this clock, clk_hi, cannot be zero volts zero volts in modern CMOS processes when Avccrst>Avcc. That would create reliability problems. Thus, a new logic low level for the clk_hi generator is provided, labeled Vneg_clk_ref herein. This is in turn generated by a regulator which has reference Vneg_clk_ref. However, when Avccrst<Avcc and is at its minimum value the value of Vneg_clk_ref must float downwards with Avccrst towards Avss. To do this Vneg_clk_ref is generated with respect to Avccrst supply. The reference is implemented as a stack of PMOS devices (P1 . . . Px) as illustrated in FIG. 10 which are matched to P2, P3 in the quantizer.

The disclosure further contemplates the bulk or well connection of the devices (100, 200 . . . ). In general, PMOS devices have their bulk connection tied to the highest voltage supply which is normally Avcc as illustrated in the present Figures. In general, NMOS devices have their bulk connection tied to the lowest voltage supply which is normally Avss in these diagrams. However the addition of Avccrst and Avssrst means that Avcc and Avss are not necessarily the highest and lowest supplies, respectively. It is easiest to retain the Avcc and Avss bulk connection for all PMOS and NMOS devices disclosed herein, respectively, except for the reset devices connected to Avccrst or Avssrst. However, it is also possible, in accordance with the disclosure, for connecting all PMOS and NMOS bulk connections to Avccrst or Avssrst, respectively. The bulk connection of PMOS and NMOS reset devices powered from Avccrst or Avssrst is thus application dependent.

Modern high-volume CMOS processes typically use a p-substrate with electrically isolated N-wells. PMOS devices reside in N-wells. The N-wells can be at different potentials and are connected to one or many positive supply voltages. NMOS devices reside in P-wells which are not electrically isolated from the p-substrate. The p-substrate is typically connected to zero volts and is usually denoted as Gnd or Avss.

Use of Avssrst<Avss is believed to be facilitated by either (a) a deep N-well to create electrically isolated p-substrate islands on p-substrate process, or (b) n-substrate process with electrically isolated P-wells.

It is possible to achieve connection of all PMOS/NMOS device bulks to Avccrst/Avssrst. In this instance, one can connect all PMOS device bulks to Avccrst in a high Vcm, NMOS i/p quantizer. It is also possible to connect all NMOS device bulks to Avssrst in a low Vcm, PMOS i/p quantizer. This can be advantageous as it provides for a denser layout, as all wells are of the same potential. However, the disadvantage in both cases is an increased Vt (planar processes) of all the non-reset devices whose source is still either Avcc or Avss. There are two basic options to connect the bulk of PMOS reset devices powered from Avccrst. First, one can connect the bulk to Avccrst. Second, the bulk can be connected to Avcc. Similarly, the bulk of NMOS reset devices can be connected to Avssrst, or Avss. Connecting the bulk of the reset devices to Avccrst/Avssrst tends to be safer electrically, but may take up more space. This is believed to be the best connection for non-FinFET processes where non-zero values of bulk to source voltage can impair performance.

Figure 11:
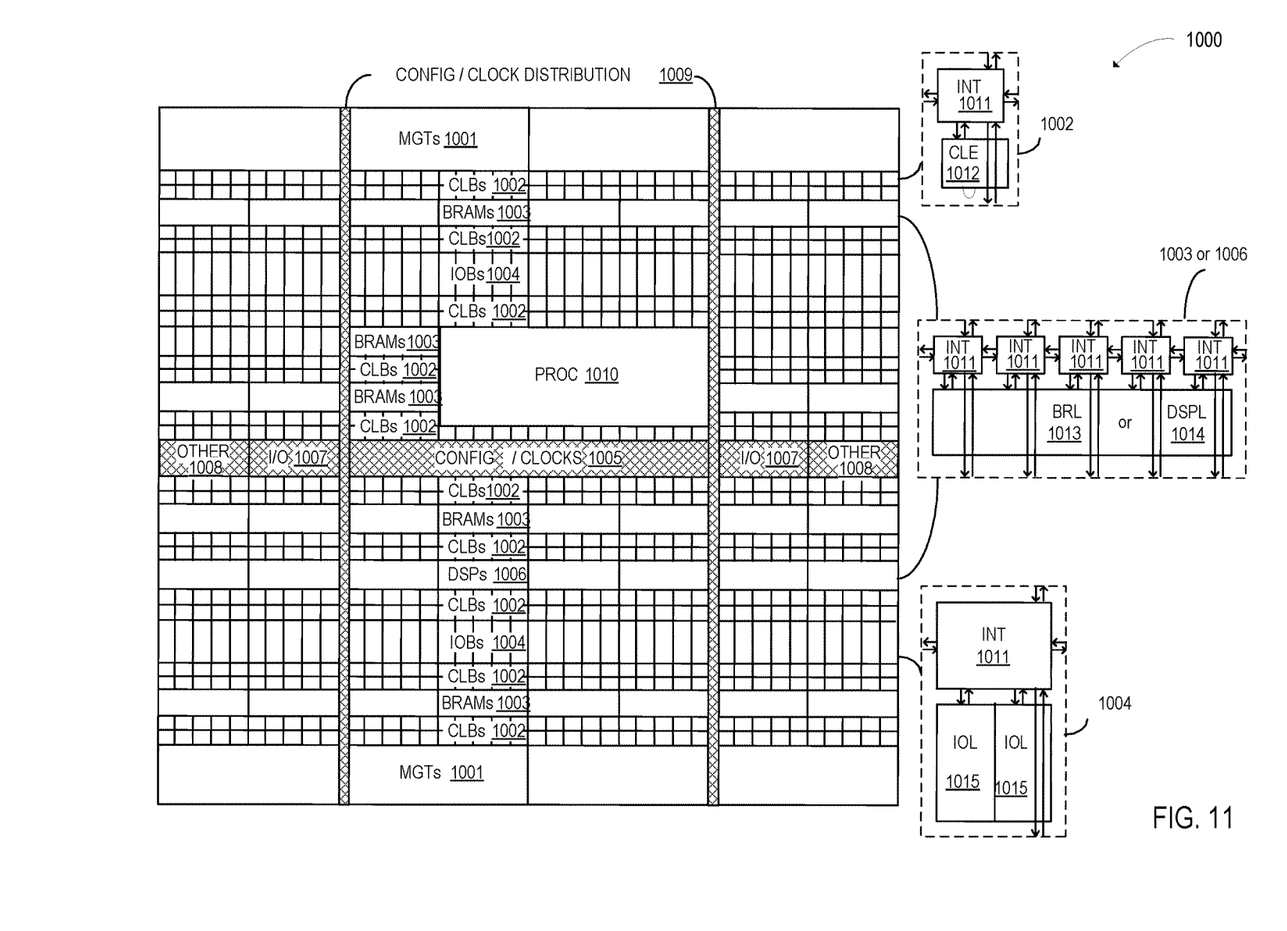
FIG. 11 shows a programmable integrated circuit (IC) on which the disclosed circuits and processes may be implemented.

FIG. 11 shows a programmable integrated circuit (IC) 1000 on which the disclosed circuits and processes may be implemented. The programmable IC may also be referred to as a System on Chip (SOC) that includes field programmable gate array logic (FPGA) along with other programmable resources. FPGA logic may include several different types of programmable logic blocks in the array. For example, FIG. 11 illustrates a programmable IC 1000 that includes a large number of different programmable tiles including multi-gigabit transceivers (MGTs) 1001, configurable logic blocks (CLBs) 1002, blocks of random access memory (BRAMs) 1003, input/output blocks (IOBs) 1004, configuration and clocking logic (CONFIG/CLOCKS) 1005, digital signal processing blocks (DSPs) 1006, specialized input/output blocks (I/O) 1007, for example, clock ports, and other programmable logic 1008 such as digital clock managers, analog-to-digital converters, system monitoring logic, and so forth. Some programmable IC having FPGA logic also include dedicated processor blocks (PROC) 1010 and internal and external reconfiguration ports (not shown).

In some FPGA logic, each programmable tile includes a programmable interconnect element (INT) 1011 having standardized connections to and from a corresponding interconnect element in each adjacent tile. Therefore, the programmable interconnect elements taken together implement the programmable interconnect structure for the illustrated FPGA logic. The programmable interconnect element INT 1011 also includes the connections to and from the programmable logic element within the same tile, as shown by the examples included at the top of FIG. 11.

For example, a CLB 1002 can include a configurable logic element CLE 1012 that can be programmed to implement user logic, plus a single programmable interconnect element INT 1011. A BRAM 1003 can include a BRAM logic element (BRL) 1013 in addition to one or more programmable interconnect elements. Often, the number of interconnect elements included in a tile depends on the height of the tile. In the pictured implementation, a BRAM tile has the same height as five CLBs, but other numbers (e.g., four) can also be used. A DSP tile 1006 can include a DSP logic element (DSPL) 1014 in addition to an appropriate number of programmable interconnect elements. An 10B 1004 can include, for example, two instances of an input/output logic element (IOL) 1015 in addition to one instance of the programmable interconnect element INT 1011. As will be clear to those of skill in the art, the actual I/O bond pads connected, for example, to the I/O logic element 1015, are manufactured using metal layered above the various illustrated logic blocks, and typically are not confined to the area of the input/output logic element 1015.

In the pictured implementation, a columnar area near the center of the die (shown shaded in FIG. 11) is used for configuration, clock, and other control logic. Horizontal areas 1009 extending from the column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 11 include additional logic blocks that disrupt the regular columnar structure making up a large part of the programmable IC. The additional logic blocks can be programmable blocks and/or dedicated logic. For example, the processor block PROC 1010 shown in FIG. 11 spans several columns of CLBs and BRAMs.

Note that FIG. 11 is intended to illustrate only an example of programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 11 are provided purely as examples. For example, in an actual programmable IC, more than one adjacent column of CLBs is typically included wherever the CLBs appear, to facilitate the efficient implementation of user logic.

For the various flow diagrams depicted herein, the particular orders of the blocks and associated functions are provided as examples. The ordering is not necessarily limiting and can be varied according to various implementations.

Those skilled in the art will appreciate that various alternative computing arrangements, including one or more processors and a memory arrangement configured with program code, would be suitable for hosting the processes and data structures that may carry out functions disclosed herein. In addition, the processes may be provided via a variety of computer-readable storage media or delivery channels such as magnetic or optical disks or tapes, electronic storage devices, or as application services over a network.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems that use RAM circuits. Other aspects and features will be apparent to those skilled in the art from consideration of the specification. The portions of the methods and system may be implemented as one or more processors configured to execute software, as an application specific integrated circuit (ASIC), or as a logic on a programmable logic device. Moreover, the various circuits identified herein may share hardware circuitry, such as use of a common computer processing unit or digital processing unit. It is intended that the specification and drawings be considered as examples only, with a true scope of the invention being indicated by the following claims.

What is claimed is:

1. A quantizer circuit for digitizing an analog signal, comprising:
   an input circuit including a plurality of input field effect transistors, the input circuit being coupled to a first voltage supply that supplies an input signal at a first voltage, wherein the input circuit converts the input signal into an input current that is integrated during an input sampling phase of an active cycle of operation of the quantizer circuit;
   a regeneration circuit coupled to the input circuit, the regeneration circuit including a plurality of regeneration field effect transistors, the regeneration circuit being connected to a second voltage supply at a second voltage, the second voltage being different from the first voltage; and
   a reset circuit coupled to the input circuit and the regeneration circuit.

2. The quantizer circuit of claim 1, wherein the first voltage and second voltage are fixed.

3. The quantizer circuit of claim 1, wherein the first voltage is higher than the second voltage to reduce noise and voltage offset in the quantizer circuit.

4. The quantizer circuit of claim 1, wherein the first voltage is lower than the second voltage to improve timing performance of the quantizer circuit.

5. The quantizer circuit of claim 1, wherein:
   the input circuit is configured to receive a first time varying first clock signal;

the input circuit is further configured to receive a second time varying clock signal; and the magnitude of the second clock signal is generated with reference to the first clock signal.

6. The quantizer circuit of claim 5, wherein the second clock signal is generated by a circuit supplied from a regulator that is configured to receive a signal indicative of the first clock signal.

7. The quantizer circuit of claim 1, wherein the second voltage is at ground and the first voltage is lower than the second voltage to reduce noise and voltage offset in the quantizer circuit.

8. The quantizer circuit of claim 1, wherein the second voltage is at ground and the first voltage is higher than the second voltage to improve timing performance of the quantizer circuit.

9. The quantizer circuit of claim 1, further comprising a control circuit that is configured to increase or decrease magnitude of the first voltage, wherein the control circuit includes an analog control circuit that is configured to generate a reference signal representative of the first voltage.

10. The quantizer circuit of claim 9, further comprising a regulator in operable communication with the analog control circuit, the regulator being configured to output the first voltage to the quantizer circuit in response to the reference signal that is representative of the first voltage.

11. The quantizer circuit of claim 9, wherein the analog control circuit generates the reference signal in response to a plurality of input signals.

12. The quantizer circuit of claim 11, wherein the plurality of input signals include signals indicative of at least one of a magnitude of the second voltage, a magnitude of a common mode voltage, a process dependent voltage, a temperature dependent voltage, or a shift voltage.

13. The quantizer circuit of claim 1, further comprising a control circuit that is configured to increase or decrease magnitude of the first voltage, wherein the control circuit includes:

at least one analog-to-digital converter that is configured to receive a plurality of input signals and generate digital input signal data, wherein the input signals include signals indicative of at least one of a magnitude of the second voltage, a process dependent voltage, a magnitude of a common mode voltage, a temperature dependent voltage, or a shift voltage;

a programmable integrated circuit operably coupled to the at least one analog-to-digital converter, the programmable integrated circuit being configured to process the digital input signal data to determine circuit configuration data and generate a circuit configuration data digital output signal, wherein the programmable integrated circuit is programmed with executable code for determining the configuration data; and at least one digital-to-analog converter operably coupled to the programmable integrated circuit, the at least one digital-to-analog converter being configured to convert the circuit configuration data digital output signal into the reference signal representative of the first voltage.

14. The quantizer circuit of claim 13, further comprising a regulator in operable communication with the at least one digital-to-analog converter, the regulator being configured to output the first voltage to the quantizer circuit in response to the reference signal that is representative of the first voltage.

15. The quantizer circuit of claim 11, wherein the quantizer includes a bulk or well connection.

16. The quantizer circuit of claim 1, wherein the plurality of input field effect transistors include N-type field effect transistors, and further wherein the input circuit does not draw current when the first clock signal is below a threshold voltage.

17. The quantizer circuit of claim 1, wherein the plurality of input field effect transistors include P-type field effect transistors, and further wherein the input circuit does not draw current when the first clock signal is above a threshold voltage.

18. The quantizer of claim 1, wherein the reset circuit includes a first set of transistors that couple the input circuit to the first voltage supply, a second set of transistors that couple the regeneration circuit to the second voltage supply, and a third transistor that couples a plurality of output pins of the quantizer to each other.

19. The quantizer of claim 1, wherein the each of the input circuit and regeneration circuit are configured and arranged to have separate currents and a plurality of clock signal inputs which allow input stage gain and regeneration stage timing to be controlled separately.

20. The quantizer of claim 1, wherein the quantizer is configured and arranged to provide for a plurality of pairs of gain paths from a plurality of input pins to a plurality of output pins.

* * * * *